(12) United States Patent
Kumar et al.

(10) Patent No.: US 10,243,016 B2
(45) Date of Patent: Mar. 26, 2019

(54) HETEROGENEOUS INTEGRATION USING WAFER-TO-WAFER STACKING WITH DIE SIZE ADJUSTMENT

(71) Applicant: INTERNATIONAL BUSINESS MACHINES CORPORATION, Armonk, NY (US)

(72) Inventors: Arvind Kumar, Chappaqua, NY (US); Mark Lamorey, Williston, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/952,888

(22) Filed: Apr. 13, 2018

(65) Prior Publication Data

US 2018/0233526 A1 Aug. 16, 2018

Related U.S. Application Data

(63) Continuation of application No. 15/656,402, filed on Jul. 21, 2017, now Pat. No. 10,002,900, which is a continuation of application No. 15/148,615, filed on May 6, 2016, now Pat. No. 9,881,956.

(51) Int. Cl.
*H01L 21/00* (2006.01)
*H01L 27/146* (2006.01)

(52) U.S. Cl.
CPC .... *H01L 27/14634* (2013.01); *H01L 27/1464* (2013.01); *H01L 27/1469* (2013.01); *H01L 27/14636* (2013.01); *H01L 27/14687* (2013.01); *H01L 27/14698* (2013.01)

(58) Field of Classification Search
CPC .................. H01L 29/66969; H01L 21/02565
See application file for complete search history.

(56) References Cited

U.S. PATENT DOCUMENTS

| | | | |
|---|---|---|---|
| 7,468,304 B2 * | 12/2008 | Kaji | H01L 21/02554 438/149 |
| 8,563,403 B1 | 10/2013 | Farooq et al. | |
| 8,679,905 B2 * | 3/2014 | Shieh | H01L 21/428 257/E21.618 |
| 8,753,913 B2 | 6/2014 | Or-Bach et al. | |
| 8,765,578 B2 | 7/2014 | LaTulipe, Jr. et al. | |

(Continued)

OTHER PUBLICATIONS

List of IBM Patents or Patent Applications Treated as Related dated Jul. 21, 2017, 2 pages.

(Continued)

*Primary Examiner* — Caleb Henry
(74) *Attorney, Agent, or Firm* — Tutunjian & Bitetto, P.C.; Vazken Alexanian (57) ABSTRACT

A method is provided for three-dimensional wafer scale integration of heterogeneous wafers with unequal die sizes that include a first wafer and a second wafer. The method includes manufacturing the second wafer in accordance with a periodicity that matches the periodicity of the first wafer. The method further includes placing, by a laser-based patterning device, a pattern in spaces between dies of the second wafer. The method also includes stacking the first wafer onto the second wafer. The first wafer includes logic circuitry, and the second wafer includes a backside illuminated image sensor.

20 Claims, 12 Drawing Sheets

(56) References Cited

U.S. PATENT DOCUMENTS

| | | | |
|---|---|---|---|
| 8,877,533 B2* | 11/2014 | Choi | H01L 29/66969 438/104 |
| 8,900,885 B1 | 12/2014 | Hubbard et al. | |
| 8,962,376 B2 | 2/2015 | Atanackovic et al. | |
| 9,028,628 B2 | 5/2015 | Linet et al. | |
| 9,048,322 B2* | 6/2015 | Lee | H01L 29/66969 |
| 9,059,039 B2 | 6/2015 | LaTulipe, Jr. et al. | |
| 9,129,992 B2* | 9/2015 | Zhang | H01L 29/78648 |
| 9,142,709 B2 | 9/2015 | Lu et al. | |
| 9,143,710 B2 | 9/2015 | Lee et al. | |
| 9,214,435 B2 | 12/2015 | Farooq et al. | |
| 9,252,284 B2* | 2/2016 | Lee | H01L 29/7869 |
| 9,252,285 B2* | 2/2016 | Seo | H01L 29/7869 |
| 9,306,116 B2 | 4/2016 | El-Ghoroury et al. | |
| 9,312,254 B2 | 4/2016 | Ken | |
| 9,379,159 B2 | 6/2016 | Qian et al. | |
| 9,397,221 B2* | 7/2016 | Su | H01L 21/02565 |
| 9,515,100 B2* | 12/2016 | Im | H01L 21/02532 |
| 2010/0072435 A1* | 3/2010 | Honda | H01B 1/22 252/519.51 |
| 2012/0231572 A1 | 9/2012 | Or-Bach et al. | |
| 2014/0011329 A1* | 1/2014 | Zhang | H01L 29/66969 438/158 |
| 2014/0061633 A1* | 3/2014 | Wang | H01L 21/02172 257/43 |
| 2014/0071364 A1* | 3/2014 | Liu | G02F 1/1362 349/43 |
| 2014/0339537 A1* | 11/2014 | Bae | H01L 29/78636 257/43 |
| 2015/0035169 A1 | 2/2015 | Farooq et al. | |
| 2015/0137113 A1* | 5/2015 | Yu | H01L 29/7869 257/43 |
| 2015/0171219 A1* | 6/2015 | Jiang | H01L 29/66969 257/43 |
| 2015/0179679 A1* | 6/2015 | Im | H01L 21/02532 257/43 |
| 2015/0194475 A1* | 7/2015 | Kawashima | H01L 29/7869 257/40 |
| 2015/0221775 A1* | 8/2015 | Yamazaki | H01L 29/7869 257/43 |
| 2015/0249161 A1* | 9/2015 | Su | H01L 21/02565 257/43 |
| 2015/0263088 A1 | 9/2015 | Cheng et al. | |
| 2015/0270141 A1 | 9/2015 | Chou | |
| 2015/0270308 A1 | 9/2015 | Choi | |
| 2015/0270406 A1* | 9/2015 | Sun | H01L 29/78606 257/29 |
| 2015/0280002 A1* | 10/2015 | Lu | H01L 29/7869 257/43 |
| 2015/0295091 A1* | 10/2015 | Cao | G02F 1/1368 257/43 |
| 2016/0043227 A1* | 2/2016 | Zhang | H01L 29/7869 257/43 |
| 2016/0233338 A1* | 8/2016 | Lu | H01L 29/7869 |

OTHER PUBLICATIONS

Aoki, et al., "A Rolling-Shutter Distortion-Free 3D Stacked Image Sensor with -160dB Parasitic Light Sensitivity In-Pixel Storage Node", IEEE International Solid-State Circuits Conference, Feb. 2013, pp. 482-484.

Coudrain, et al., "3D Integration of CMOS Image Sensor with Coprocessor Using TSV last and Micro-Bumps Technologies", 2013 Electronic Components & Technology Conference, May 2103, pp. 674-682.

EVG Solid State Technology, "Fusion Bonding for Next-Generation", Jul. 2014, pp. 1-7, vol. 57, No. 5.

Nandakumar, et al., "Layout Effects in Fine Grain 3D Integrated Regular Microprocessor Blocks", IEEE Explore, DAC, Jun. 2011, pp. 639-644.

Schrems, et al., "Manufacturing of 3D Integrated Sensors and Circuits", IEEE, 2014 44th European Solid State Device Research Conference (ESSDERC), Sep. 2014, pp. 162-165.

ISSCC 2013, Session 27, Image Sensors, IEEE International Solid-State Circuits Conference, Feb. 2013, pp. 1-355.

Sukegawa, et al., "A 1/4-inch 8Mpixel Back-Illuminated Stacked CMOS Image Sensor", 2013 IEEE International Solid-State Circuits Conference, pp. 1-3, Feb. 2013.

List of IBM Patents or Patent Applications Treated as Related dated Jan. 11, 2018, 2 pages.

List of IBM Patents or Patent Applications Treated as Related dated Apr. 13, 2018, 2 pages.

* cited by examiner

HETEROGENEOUS INTEGRATION USING WAFER-TO-WAFER STACKING WITH DIE SIZE ADJUSTMENT

BACKGROUND

Technical Field

The present invention generally relates to semiconductor devices, and more particularly to heterogeneous integration using wafer-to-wafer stacking with die size adjustment.

Description of the Related Art

Sensors combined with integrated logic circuits are key components of intelligent systems. Such systems are characterized by real-time, high-bandwidth processing, requiring high interconnect density and close-proximity coupling between the sensor elements and the logic processing elements. Additionally, compact form factor and low power are highly desirable attributes for mobile applications.

Three-dimensional (3D) Wafer-to-Wafer stacking offers the potential for much higher interconnect densities than either conventional two-dimensional (2D) packaging or 3D chip-to-chip stacking. In particular, compared to chip-to-chip stacking, wafer-to-wafer stacking enables scaling down of the interconnect dimension and pitch through thinning down of the wafer, which allows preservation of the via aspect ratio.

However, sensors and logic processors are fabricated on different wafers using appropriately optimized technologies. Thus, the die sizes on the two wafers are unlikely to be equal, precluding wafer-to-wafer bonding. Hence, there is a need for heterogeneous circuit integration using wafer-to-wafer stacking for situations including, e.g., wafers with differently sized dies.

SUMMARY

According to an aspect of the present invention, a method is provided for three-dimensional wafer scale integration of heterogeneous wafers with unequal die sizes that include a first wafer and a second wafer. The method includes manufacturing the second wafer in accordance with a periodicity that matches the periodicity of the first wafer. The method further includes placing, by a laser-based patterning device, a pattern in spaces between dies of the second wafer. The method also includes stacking the first wafer onto the second wafer. The first wafer includes logic circuitry, and the second wafer includes a backside illuminated image sensor.

According to another aspect of the present invention, a non-transitory computer readable storage medium is provided. The non-transitory computer readable storage medium includes a computer readable program for three-dimensional wafer scale integration of heterogeneous wafers with unequal die sizes that include a first wafer and a second wafer. The computer readable program when executed on a computer causes the computer to perform a method. The method includes manufacturing the second wafer in accordance with a periodicity that matches the periodicity of the first wafer. The method further includes placing, by a laser-based patterning device, a pattern in spaces between dies of the second wafer. The method also includes stacking the first wafer onto the second wafer. The first wafer includes logic circuitry, and the second wafer includes a backside illuminated image sensor.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

The present principles are directed to heterogeneous integration using wafer-to-wafer stacking with die size adjustment.

In an embodiment, the present principles use a single mask set to realize a wafer, where the chip periodicity (die-to-die pitch) can be selected at the time of manufacturing to enable heterogeneous wafer stacking.

Figure 1:
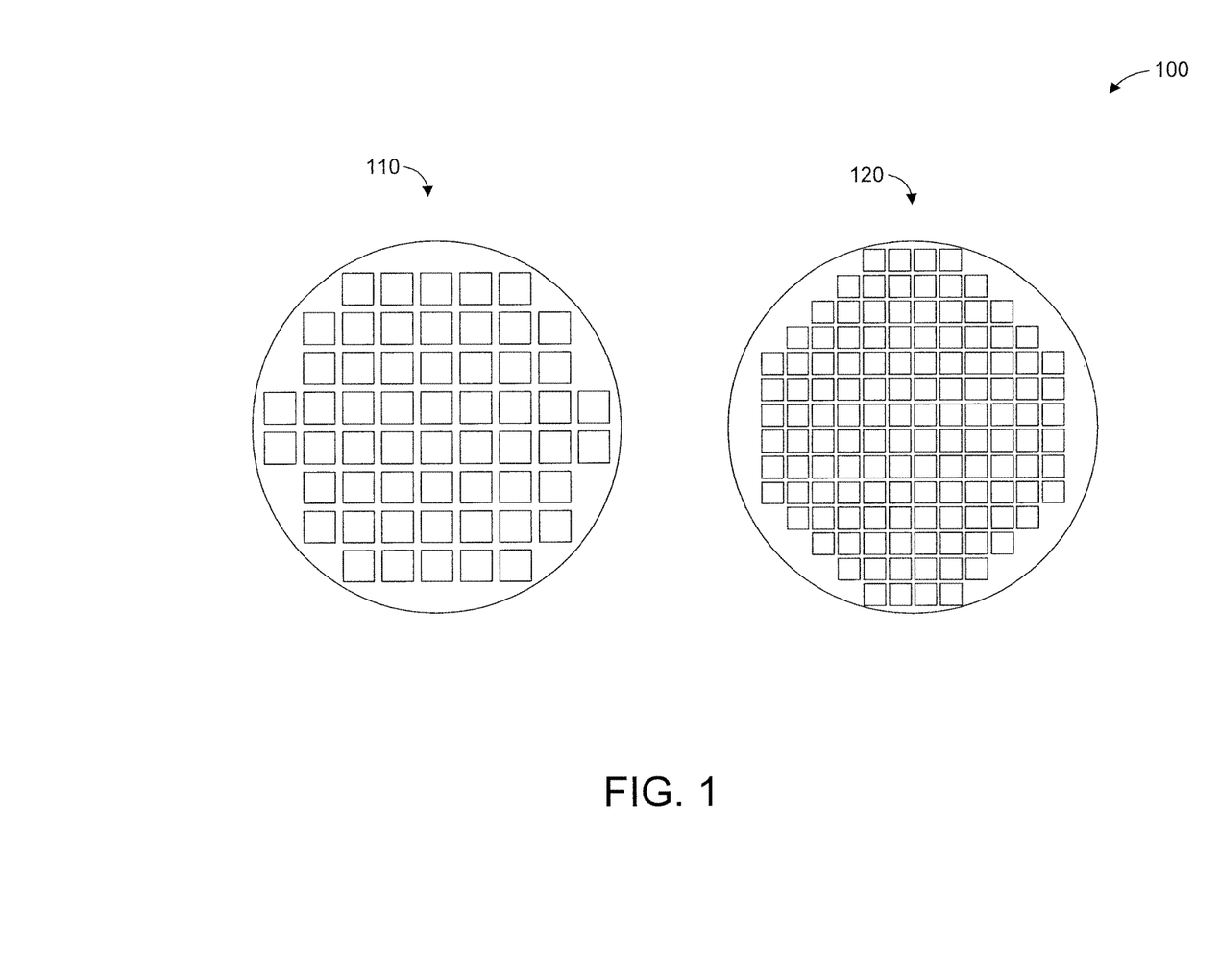
FIG. 1 shows exemplary component wafers 100 to which the present principles can be applied, in accordance with an embodiment of the present principle.

FIG. 1 shows exemplary component wafers 100 to which the present principles can be applied, in accordance with an embodiment of the present principles.

The exemplary component wafers 100 include a first component wafer (hereinafter "first wafer") 110 and a second component wafer (hereinafter "second wafer") 120.

The first wafer 110 is formed using a larger die than the second component wafer 120. The first wafer is printed using a mask set 1.

The second wafer 120 is formed using a smaller die than the first component wafer 110. The second wafer is printed using a mask set 2.

For the sake of illustration, the first wafer can be considered to be a logic wafer and the second wafer can be considered to be a sensor wafer. Of course, the first wafer and the second wafer can pertain to other types of circuits, while maintaining the spirit of the present principles.

In some of the FIGURES described herein, an arrow adjacent a wafer or a die indicates the orientation thereof, with the arrow pointing from the back of the item (corresponding to the arrow end) to the front of the item (corresponding to the arrow head). Moreover, various layers are depicted in some of the FIGURES described herein. It is to be appreciated that the thicknesses of these layers are shown at an arbitrary thicknesses for the sake of illustration and can thus vary depending upon the implementation.

Figure 5:
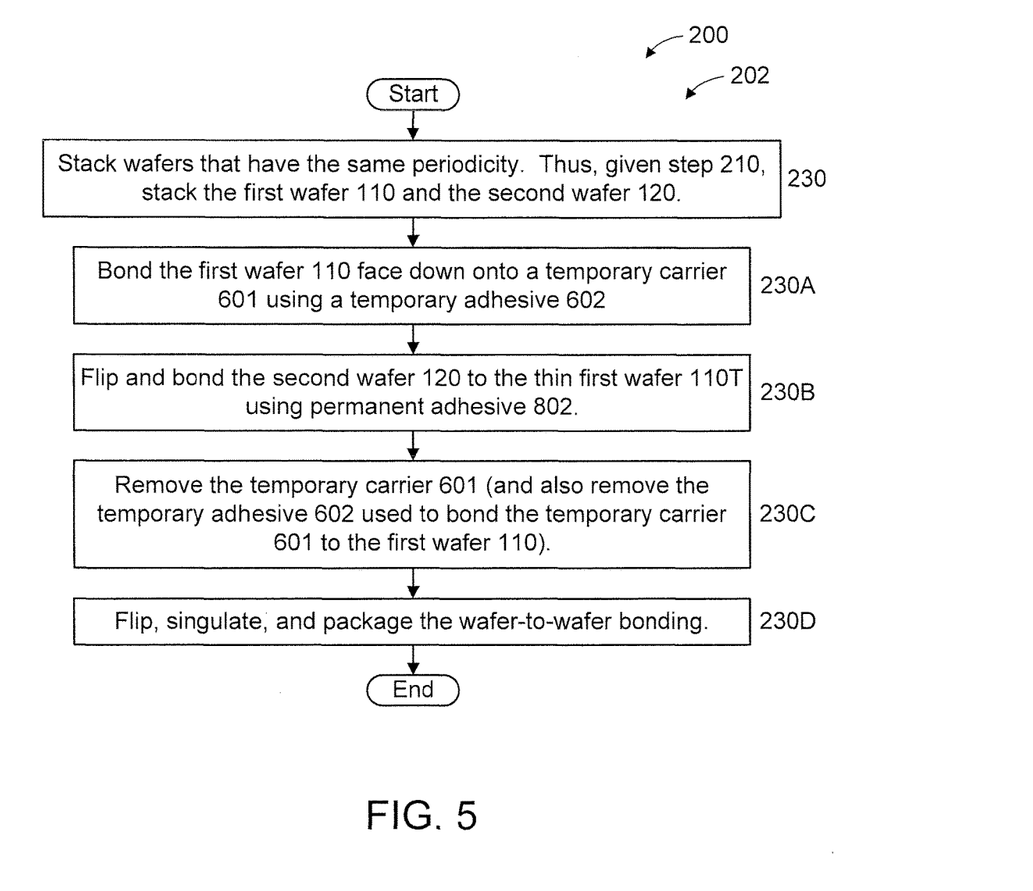
FIG. 5 shows a flowchart for a subsequent part of a method for heterogeneous integration using wafer-to-wafer stacking with die size adjustment, in accordance with an embodiment of the present principles.

Hereinafter, FIG. 2 describes method steps for an initial part 201 of a method 200 for heterogeneous integration using wafer-to-wafer stacking with die size adjustment. FIG. 5 describes method steps for a subsequent part 202 of method 200, while FIG. 6 describes method steps for another subsequent part 203 of method 200. Either subsequent part 202 or subsequent part 203 is performed after initial part 201 in order to form a wafer-to-wafer bonding in accordance with the present principles. That is, subsequent part 202 corresponds to one way to complete the heterogeneous integration commenced by initial part 201, while subsequent part 203 corresponds to another way to complete the heterogeneous integration commenced by initial part 201.

Figure 2:
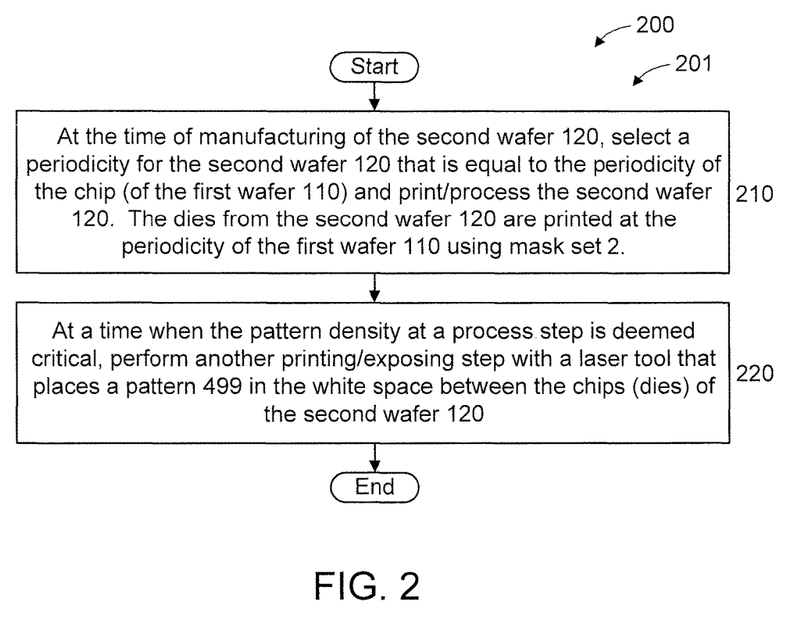
FIG. 2 shows a flowchart for an initial part of a method for heterogeneous integration using wafer-to-wafer stacking with die size adjustment, in accordance with an embodiment of the present principles.

FIG. 2 shows a flowchart for an initial part 201 of a method 200 for heterogeneous integration using wafer-to-wafer stacking with die size adjustment, in accordance with an embodiment of the present principles.

At step 210, at the time of manufacturing of the second wafer 120, select a periodicity for the second wafer 120 that is equal to the periodicity of the chip (of the first wafer 110) and print/process the second wafer 120. Thus, the dies from the second wafer 120 are printed at the periodicity of the first wafer 110 using mask set 2.

Figure 3:
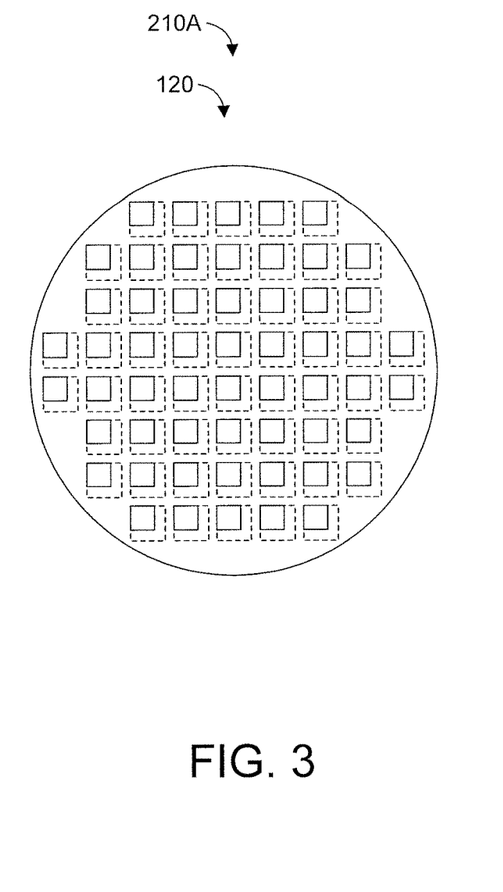
FIG. 3 graphically shows the second wafer at a process step where pattern density is deemed critical, in accordance with an embodiment of the present principles.

FIG. 3 graphically shows the second wafer 120 at a process step 210A (corresponding to the processing performed at step 210 of method 200 of FIG. 2) where pattern density is deemed critical, in accordance with an embodiment of the present principles.

At step 220, at a time when the pattern density at a process step is deemed critical (e.g., as shown with respect to process step 210A in FIG. 3), perform another printing/exposing step with a laser tool that places a pattern 499 in the white space between the chips (dies) of the second wafer 120. The pattern 499 is depicted using diagonal hatching in FIG. 4. In an embodiment, the pattern 499 can be used to meet pattern density requirements.

Figure 4:
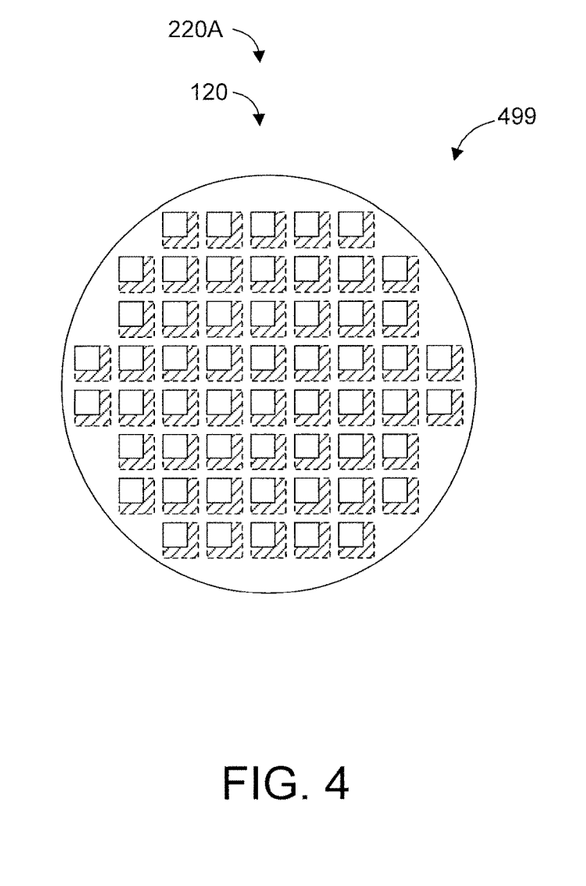
FIG. 4 graphically shows the second wafer at a process step where another printing/exposing step is performed such that the white space between the chips (dies) of the second wafer is filled with a pattern by a laser tool.

FIG. 4 graphically shows the second wafer 120 at a process step 220A where another printing/exposing step is performed such that the white space between the chips (dies) of the second wafer 120 is filled with a pattern 499 by a laser tool. The pattern 499 is shown using diagonal hatching.

FIG. 5 shows a flowchart for a subsequent part 202 of a method 200 for heterogeneous integration using wafer-to-wafer stacking with die size adjustment, in accordance with an embodiment of the present principles.

At step 230, stack wafers that have the same periodicity. Thus, given step 210 above, stack the first wafer 110 and the second wafer 120. Thus, relative to a given "starting wafer", one or more other wafers are stacked thereon that periodicity that match the periodicity of the starting wafer (but not the chip).

In an embodiment, step 230 includes steps 230A-230D.

Figure 6:
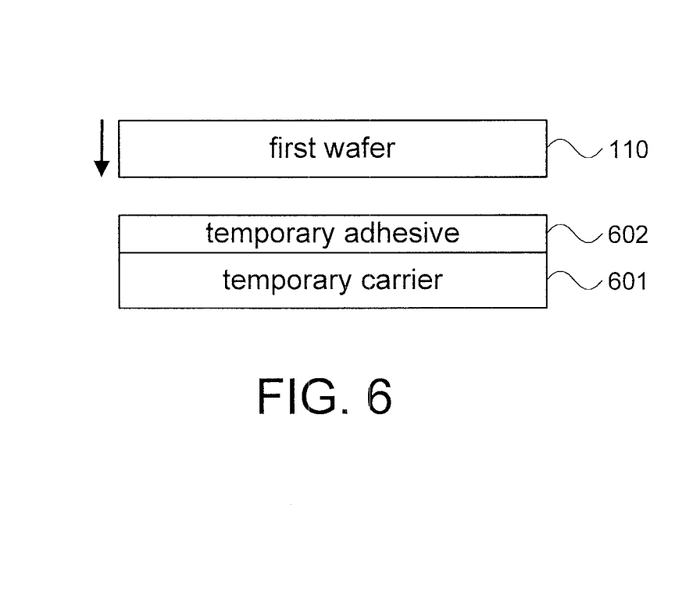
FIG. 6 graphically shows the first wafer and the temporary carrier in preparation for bonding, in accordance with an embodiment of the present principles.
Figure 7:
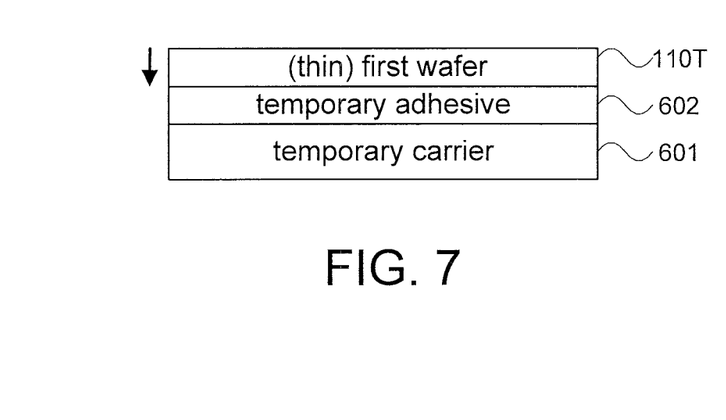
FIG. 7 graphically shows the thin first wafer, in accordance with an embodiment of the present principles.

At step 230A, bond the first wafer 110 face down onto a temporary carrier 601 using a temporary adhesive 602. FIG. 6 graphically shows the first wafer 110 and the temporary carrier 601 in preparation for bonding per step 230A, in accordance with an embodiment of the present principles. The result of step 230A is a thin first wafer 110T (hereinafter interchangeably referred to as "first wafer" followed by the reference numeral 110T to distinguish from the "non-thin" first wafer 110 from which the "thin" first wafer is formed at step 230A). The first wafer is thinned using one or more known standard techniques such as mechanical grinding, chemical metal polishing, and wet and dry etching. FIG. 7 graphically shows the thin first wafer 110T resulting from step 230A, in accordance with an embodiment of the present principles.

Figure 8:
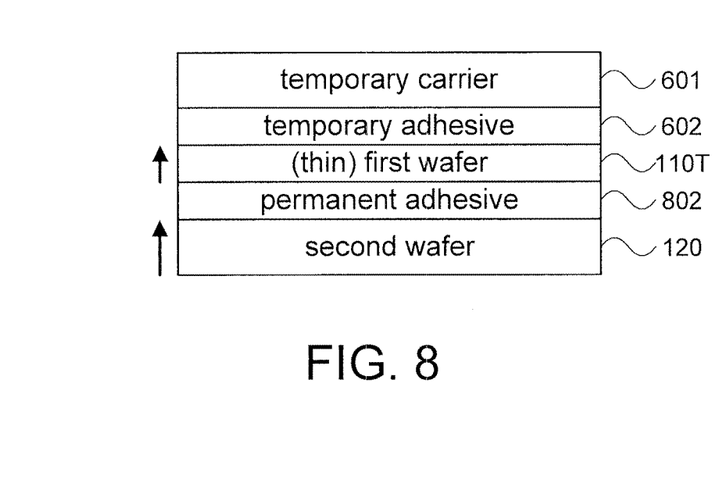
FIG. 8 graphically shows the second wafer bonded to the thin first wafer using permanent adhesive, in accordance with an embodiment of the present principles.

At step 230B, flip and bond the second wafer 120 to the thin first wafer 110T using permanent adhesive 802. FIG. 8 graphically shows the second wafer 120 bonded to the thin first wafer 110T using permanent adhesive 802, in accordance with an embodiment of the present principles. The term "permanent" in "permanent adhesive" is used to contrast the bonding at this step (230B) versus the bonding of step 230A which involved a "temporary adhesive". Thus, any more resilient bonding than a temporary adhesive/bonding can be used as element 802 such as, for example, an oxide-to-oxide bonding, and so forth, as readily appreciated by one of ordinary skill in the art.

Figure 9:
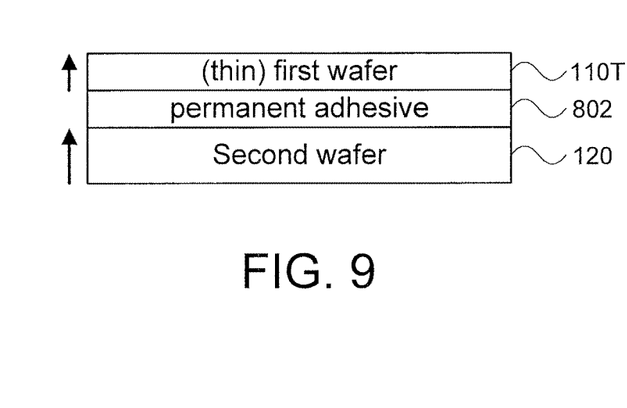
FIG. 9 graphically shows the thin first wafer bonded to the second wafer, with the temporary carrier removed, in accordance with an embodiment of the present principles.

At step 230C, remove the temporary carrier 601 (and also remove the temporary adhesive 602 used to bond the temporary carrier 601 to the first wafer 110). FIG. 9 graphically shows the thin first wafer 110T bonded to the second wafer 120 (using the permanent adhesive 802), with the temporary carrier 601 (and temporary adhesive 602) removed, in accordance with an embodiment of the present principles.

Figure 10:
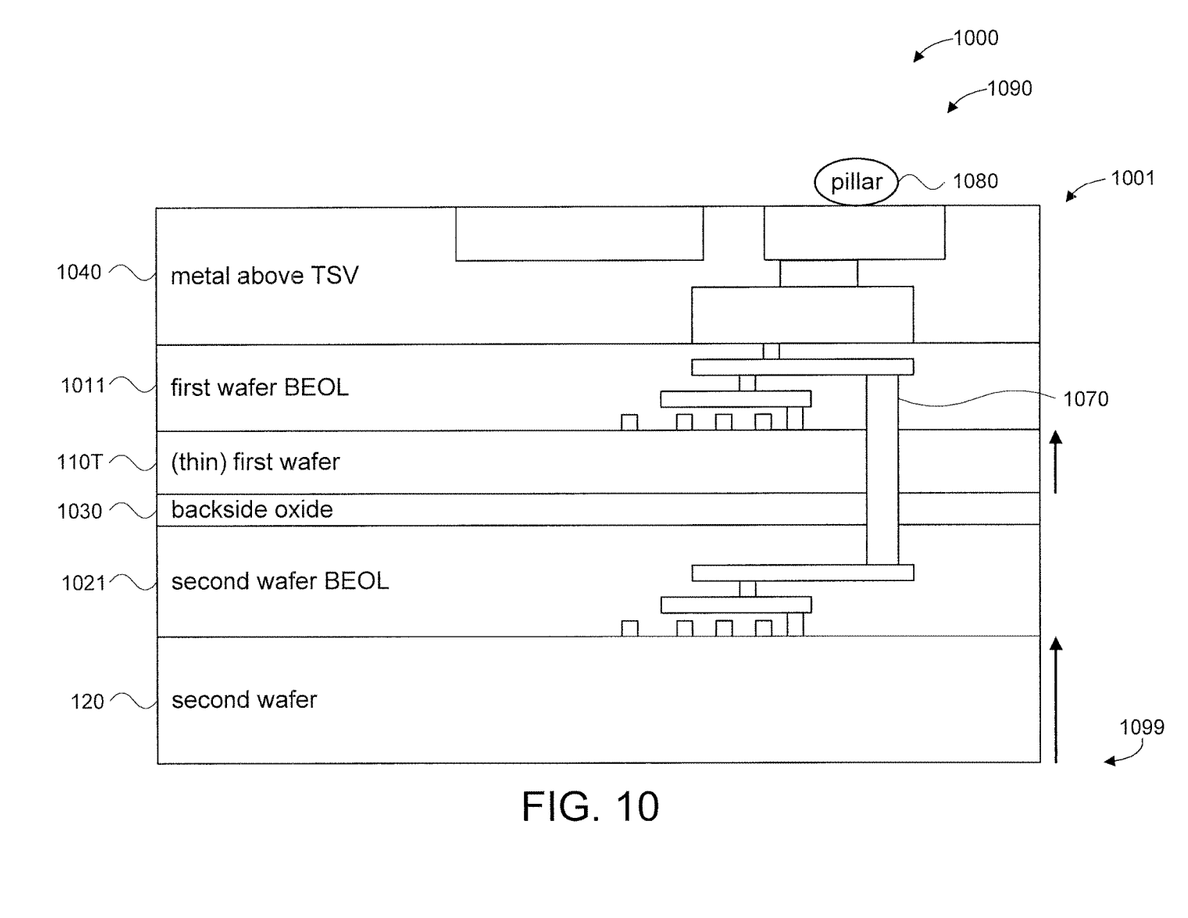
FIG. 10 shows a wafer-to-wafer bonding, in accordance with an embodiment of the present principles.

FIG. 10 shows a wafer-to-wafer bonding 1000, in accordance with an embodiment of the present principles. The wafer-to-wafer bonding 1000 can be formed, e.g., subsequent to step 230C (or subsequent to step 230D).

Starting from a back side 1099 to a front side 1001, the bonding 1000 includes: a second wafer 120 (e.g., image sensor), with its backside first (closest to backside 1099); a second wafer BEOL 1021; a backside oxide 1030; a thin first wafer 110T (e.g., logic wafer) with its backside first (closest to backside 1099); a first wafer BEOL 1011; and a metal above Through-Silicon Via (TSV) layer 1040.

In the bonding 1000, a TSV 1070 is formed through the thin first wafer 110T to contact the second wafer 120. The metal above TSV layer 1040 and a pillar 1080 are added for external contact/connection. Metallization in the second wafer BEOL 1021, the first wafer BEOL 1011, and the metal above TSV layer 1040 is generally indicated by the reference numeral 1090.

At step 230D, flip, singulate, and package the wafer-to-wafer bonding. In this way, it is possible to realize a low form-factor.

Figure 11:
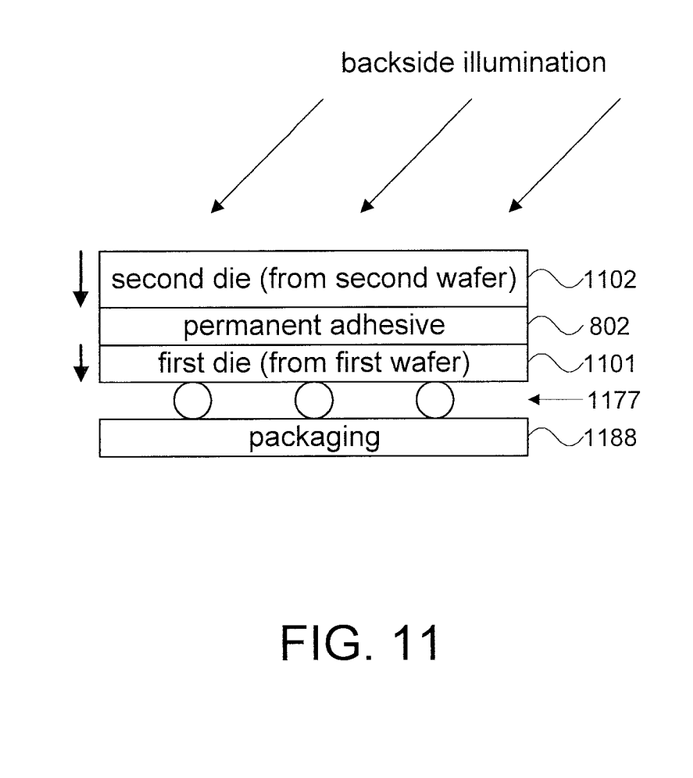
FIG. 11 shows a wafer-to-wafer bonding having a first die stacked on a second die, where the second die is an image sensor that receives backside illumination, in accordance with an embodiment of the present principles.

In an embodiment, the wafer-to-wafer bonding can include a backside illuminated image sensor with ultrahigh interconnect density. FIG. 11 shows a wafer-to-wafer bonding 1100 having a first die 1101 (from thin wafer 110T) stacked on a second die 1102 (from second wafer 120), where the second die 1102 is an image sensor that receives backside illumination, in accordance with an embodiment of the present principles. Solder bumps 1177 are used to connect the stacked dies to packaging 1188 having external connections (not shown, see FIG. 10 for an exemplary external connection configuration).

Figure 12:
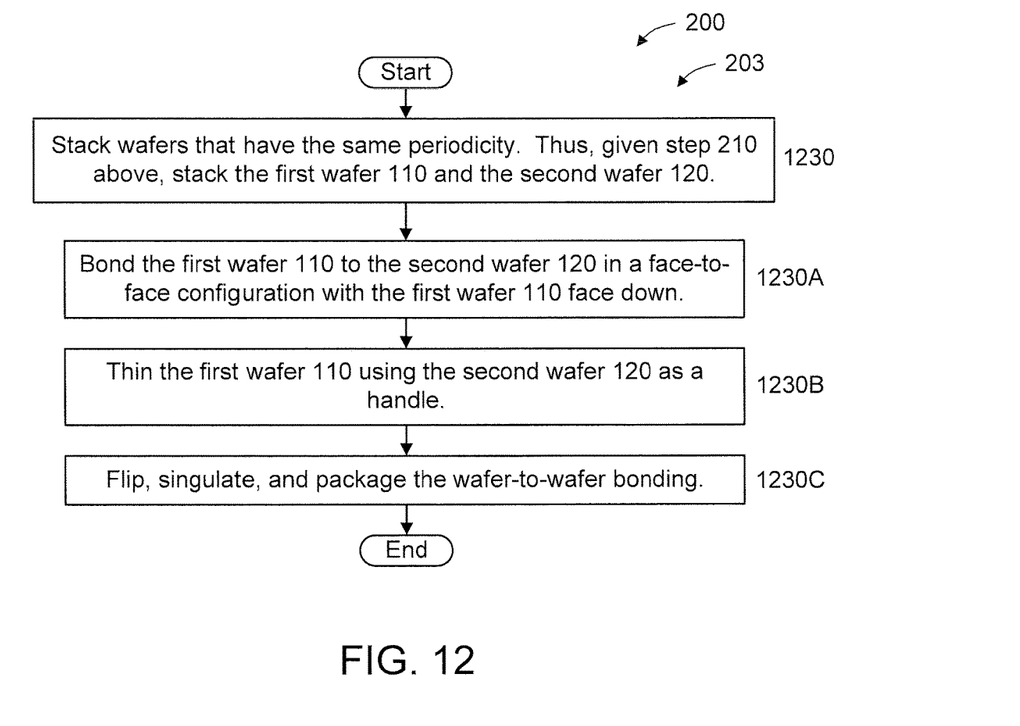
FIG. 12 shows a flowchart for a subsequent part of a method for heterogeneous integration using wafer-to-wafer stacking with die size adjustment, in accordance with an embodiment of the present principles.

FIG. 12 shows a flowchart for a subsequent part 203 of a method 200 for heterogeneous integration using wafer-to-wafer stacking with die size adjustment, in accordance with an embodiment of the present principles. Subsequent part 203 can be performed in place of subsequent part 202 shown in FIG. 5.

At step 1230, stack wafers that have the same periodicity. Thus, given step 210 above, stack the first wafer 110 and the second wafer 120. Thus, relative to a given "starting wafer", one or more other wafers are stacked thereon that periodicity that match the periodicity of the starting wafer (but not the chip).

In an embodiment, step 1230 includes steps 1230A-1230C.

Figure 13:
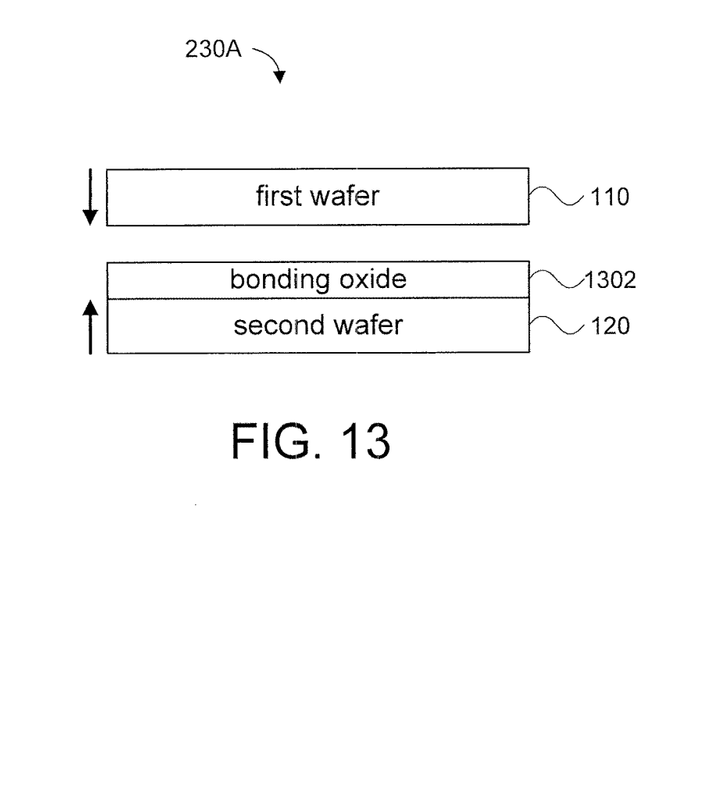
FIG. 13 graphically shows the first wafer and the second wafer in preparation for bonding, in accordance with an embodiment of the present principles.

At step 1230A, bond the first wafer 110 to the second wafer 120 in a face-to-face configuration with the first wafer 110 face down. In an embodiment, a copper-to-copper (Cu—Cu) bonding process is used. FIG. 13 graphically shows the first wafer 110 and the second wafer 120 in preparation for bonding per step 230A, in accordance with an embodiment of the present principles.

Figure 14:
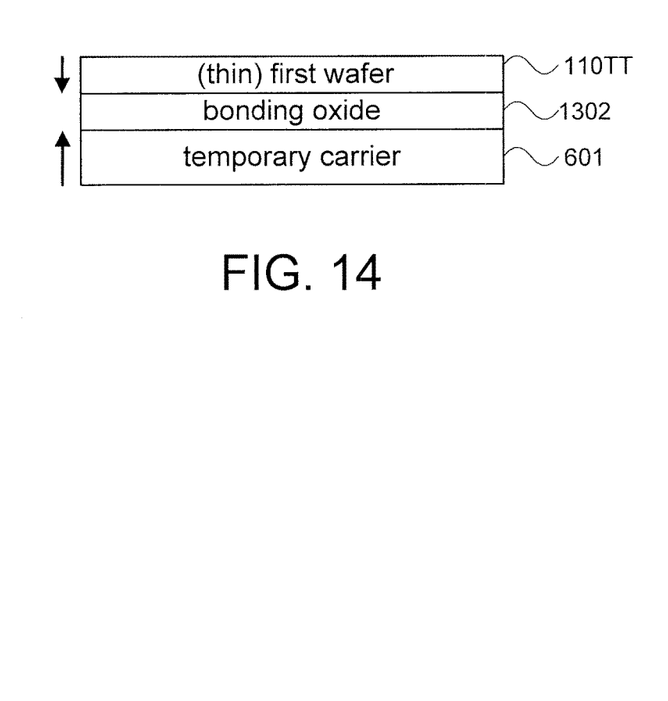
FIG. 14 graphically shows the thin first wafer, in accordance with an embodiment of the present principles.

At step 1230B, thin the first wafer 110 using the second wafer 120 as a handle. The result of step 1230B is a "thin" first wafer 110TT, relative to first wafer 110 prior to "thinning" per step 1230B. FIG. 14 graphically shows the thin first wafer 110TT resulting from step 1230B, in accordance with an embodiment of the present principles.

At step 1230C, flip, singulate, and package the wafer-to-wafer bonding. In this way, it is possible to realize a low form-factor.

Figure 15:
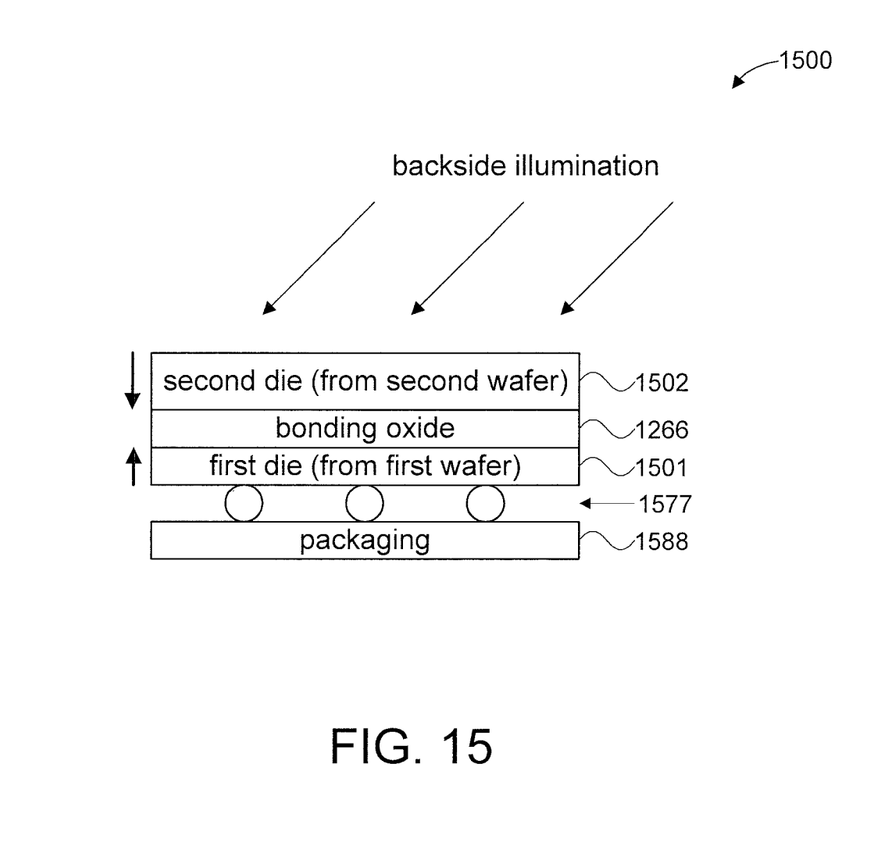
FIG. 15 shows a wafer-to-wafer bonding having a first die stacked on a second die, where the second die is an image sensor that receives backside illumination, in accordance with an embodiment of the present principles.

In an embodiment, the wafer-to-wafer bonding can include a backside illuminated image sensor with ultrahigh interconnect density. FIG. 15 shows a wafer-to-wafer bonding 1500 having a first die 1501 (from thin wafer 110TT) stacked on a second die 1502 (from second wafer 120), where the second die 1502 is an image sensor that receives backside illumination, in accordance with an embodiment of the present principles. Solder bumps 1577 are used to connect the stacked dies to packaging 1588 having external connections (not shown, see FIG. 10 for an exemplary external connection configuration).

It is to be appreciated that while some of the FIGURES described herein mention and/or otherwise involve a particular type of bonding material, the present principles are not limited to solely such materials and, thus, other bonding materials can also be used in accordance with the teachings of the present principles, while maintaining the spirit of the present principles.

Moreover, it to be appreciated that while some of the FIGURES described herein mention and/or otherwise involve the use of a laser tool for patterning, the present principles are not limited to solely such patterning technique and, thus, any patterning technique can be used in accordance with the teachings of the present principles, while maintaining the spirit of the present principles.

A description will now be given regarding some of the many attendant advantages of the present principles.

The cost of the increased Silicon (Si) wafer area required for die-size adjustment is offset by the following significant advantages of wafer-to-wafer integration versus state-of-the-art techniques: volume production; high bandwidth; compact form factor; and lower power.

Regarding volume prediction, the sensor and processor chips are all bonded in parallel, in contrast to die-to-die bonding in which the bonding is done sequentially. Since wafer bonding means all chips are joined in parallel, a high process yield is essential to cost reduction. Accurate wafer-to-wafer alignment is also critical.

Regarding high bandwidth, micro-bump pitch is typically ~50 um with a ~20 um bump size. Wafer-to-wafer bonding enables much smaller interconnect size (~1 um) and much higher density (pitch ~2 um). This higher interconnect density allows direct coupling of a sensor to a processor underneath.

Regarding compact form factor, direct wafer-to-wafer bonding, in which one wafer is thinned, is much more compact than die-to-die bonding having a layer of micro-bumps in between. This is desirable for mobile applications.

Regarding lower power, shorter wire lengths result in lower power dissipation, which is also highly desirable for mobile applications.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for three-dimensional wafer scale integration of heterogeneous wafers with unequal die sizes that include a first wafer and a second wafer, the method comprising:

manufacturing the second wafer in accordance with a periodicity that matches the periodicity of the first wafer;
placing, by a laser-based patterning device, a pattern in spaces between dies of the second wafer; and
stacking the first wafer onto the second wafer,
wherein the first wafer comprises logic circuitry, and the second wafer comprises a backside illuminated image sensor.

2. The method of claim 1, wherein said stacking step comprises:
bonding the first wafer face down onto a temporary carrier;
flipping and bonding the second wafer to the first wafer to form a wafer-to-wafer bonding;
removing the temporary carrier; and
flipping, singulating, and packaging the wafer-to-wafer bonding.

3. The method of claim 2, wherein the first wafer comprises a plurality of dies, and the second wafer comprises another plurality of dies, and wherein said bonding step bonds the pluralities of dies in parallel.

4. The method of claim 2, wherein said bonding step bonds the first wafer face down onto the temporary carrier using a temporary adhesive, and said removing step comprises removing the temporary adhesive.

5. The method of claim 2, wherein a back face of the first wafer is bonded to a front face of the second wafer.

6. The method of claim 1, wherein said stacking step comprises:
bonding the first wafer to the second wafer in a face-to-face configuration to form a wafer-to-wafer bonding; and
flipping, singulating, and packaging the wafer-to-wafer bonding.

7. The method of claim 6, wherein said stacking step further comprises, in between said bonding step and said flipping step, thinning the first wafer using the second wafer as a handle to produce a thin first wafer in the wafer-to-wafer bonding.

8. The method of claim 6, wherein the first wafer comprises a plurality of dies, and the second wafer comprises another plurality of dies, and wherein said bonding step bonds the pluralities of dies in parallel.

9. The method of claim 1, wherein said placing step is performed to meet a pattern density requirement imposed on the second wafer.

10. The method of claim 1, further comprising forming a Through-Silicon via connecting a portion of the first wafer to a portion of the second wafer.

11. The method of claim 1, wherein said stacking step uses a copper-to-copper bonding process to bond the first wafer to the second wafer.

12. The method of claim 1, wherein said stacking step comprises selectively bonding the first wafer to the second wafer face-to-face or back-to-face.

13. The method of claim 1, further comprising thinning the first wafer to form a thin first wafer used for said stacking step.

14. A non-transitory computer readable storage medium comprising a computer readable program for three-dimensional wafer scale integration of heterogeneous wafers with unequal die sizes that include a first wafer and a second wafer, wherein the computer readable program when executed on a computer causes the computer to perform a method comprising:
manufacturing the second wafer in accordance with a periodicity that matches the periodicity of the first wafer;
placing, by a laser-based patterning device, a pattern in spaces between dies of the second wafer; and
stacking the first wafer onto the second wafer,
wherein the first wafer comprises logic circuitry, and the second wafer comprises a backside illuminated image sensor.

15. The non-transitory computer readable storage medium of claim 14, wherein said stacking step comprises:
bonding the first wafer face down onto a temporary carrier;
flipping and bonding the second wafer to the first wafer to form a wafer-to-wafer bonding;
removing the temporary carrier; and
flipping, singulating, and packaging the wafer-to-wafer bonding.

16. The non-transitory computer readable storage medium of claim 15, wherein the first wafer comprises a plurality of dies, and the second wafer comprises another plurality of dies, and wherein said bonding step bonds the pluralities of dies in parallel.

17. The non-transitory computer readable storage medium of claim 14, wherein said stacking step comprises:
bonding the first wafer to the second wafer in a face-to-face configuration to form a wafer-to-wafer bonding; and
flipping, singulating, and packaging the wafer-to-wafer bonding.

18. The non-transitory computer readable storage medium of claim 17, wherein said stacking step further comprises, in between said bonding step and said flipping step, thinning the first wafer using the second wafer as a handle to produce a thin first wafer in the wafer-to-wafer bonding.

19. The non-transitory computer readable storage medium of claim 17, wherein the first wafer comprises a plurality of dies, and the second wafer comprises another plurality of dies, and wherein said bonding step bonds the pluralities of dies in parallel.

20. The non-transitory computer readable storage medium of claim 14, further comprising forming a Through-Silicon via connecting a portion of the first wafer to a portion of the second wafer.

* * * * *